(12) United States Patent
Yu

(10) Patent No.: US 9,741,301 B2
(45) Date of Patent: Aug. 22, 2017

(54) DRIVING CIRCUIT OF DISPLAY PANEL, DISPLAY DEVICE, AND METHOD FOR DRIVING THE DRIVING CIRCUIT OF THE DISPLAY PANEL

(71) Applicant: SHENZHEN CHINA STAR OPTOELECTRONICS TECHNOLOGY CO., LTD., Shenzhen (CN)

(72) Inventor: Xiaojiang Yu, Shenzhen (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 545 days.

(21) Appl. No.: 14/374,562

(22) PCT Filed: Apr. 29, 2014

(86) PCT No.: PCT/CN2014/076449
§ 371 (c)(1),
(2) Date: Jul. 25, 2014

(87) PCT Pub. No.: WO2015/158015
PCT Pub. Date: Oct. 22, 2015

(65) Prior Publication Data
US 2015/0302813 A1    Oct. 22, 2015

(30) Foreign Application Priority Data

Apr. 17, 2014 (CN) .......................... 2014 1 0155803

(51) Int. Cl.
*G06F 3/038*    (2013.01)
*G09G 3/36*    (2006.01)

(52) U.S. Cl.
CPC .......... *G09G 3/3648* (2013.01); *G09G 3/3655* (2013.01); *G09G 3/3674* (2013.01); *G09G 2310/0208* (2013.01); *G09G 2310/08* (2013.01)

(58) Field of Classification Search
CPC .. G09G 3/3648; G09G 3/3655; G09G 3/3674; G09G 2310/08; G09G 2310/0208
(Continued)

(56) References Cited

U.S. PATENT DOCUMENTS 7,738,622 B2    6/2010 Cho et al.
2013/0249882 A1    9/2013 Lin et al.

FOREIGN PATENT DOCUMENTS

CN    1862650 A    11/2006
CN    103050106 A    4/2013
(Continued)

OTHER PUBLICATIONS

Huang et al., "Improving stress effect and low noise design of the integrated on-panel TFT gate driver"; MIXDES 2010, 17th International Conference "Mixed Design of Integrated Circuits and Systems", Jun. 24-26, 2010, Warsaw, Poland; pp. 269-272.*
(Continued)

*Primary Examiner* — Kent Chang
*Assistant Examiner* — Mark Edwards

(57) ABSTRACT

A driving circuit of a display panel includes a switching unit, a clamping unit that prevents reverse current leakage, a reference signal line coupled to a low level signal, a pull-up unit, and a pull-up control unit that drives the pull-up unit. An input end of the pull-up unit receives a second clock signal, and an output end of the pull-up unit is coupled to a current scan line, where the current scan line is coupled to a pull-down maintain unit, and the pull-down maintain unit includes a first switching unit and a second switching unit.

(Continued)

The first switching unit and the second switching unit are connected between the current scan line and the reference signal line in parallel, where a control end of the first switching unit and a control end of the second switching unit are coupled to an output end of the switching unit, a control end of the switching unit receives a first clock signal, and an input end of the switching unit receives the second clock signal through the clamping unit.

15 Claims, 4 Drawing Sheets

(58) Field of Classification Search
USPC .......................................................... 345/204
See application file for complete search history.

(56) References Cited

FOREIGN PATENT DOCUMENTS

| CN | 103680386 A | 3/2014 |
|----|-------------|--------|
| CN | 103680388 A | 3/2014 |
| CN | 103680451 A | 3/2014 |

OTHER PUBLICATIONS

Li Jun, the International Searching Authority written comments, Jan. 2015, CN.

* cited by examiner

DRIVING CIRCUIT OF DISPLAY PANEL, DISPLAY DEVICE, AND METHOD FOR DRIVING THE DRIVING CIRCUIT OF THE DISPLAY PANEL

TECHNICAL FIELD

The present disclosure relates to the field of display, and more particularly to a driving circuit of a display panel, a display device, and a method for driving the driving circuit of the display panel.

BACKGROUND

Horizontal scan lines of a typical active flat display panel are mainly driven by an external integrated circuit (IC) of the display panel, where the external IC can control cascaded charging and discharging of each of levels of the horizontal scan lines. A gate driver on array (GOA) circuit, driving the horizontal scan line, can be arranged on a substrate surrounding a display area of the display panel through manufacturing of the flat display panel according to GOA technology, where the GOA circuit drives the horizontal scan line instead of the external IC. Bonding process of the external IC is reduced using the GOA technology, which increases productivity and reduces costs.

More particularly to the GOA circuit of a liquid crystal display (LCD) panel, reduction of size of the GOA circuit makes the GOA circuit fit a flat display produce having the narrow frame, further avoids dust in the manufacturing process of the display panel, and increases yield.

A typical GOA circuit keeps low level status of the scan line through two low level signals when the scan lines are in non-working time, and two pull-down maintaining units, which maintain the low level signal, are accordingly needed. However, because the GOA circuit occupies space of the display panel, it is difficult to narrow frame size of the display panel. Thus, reduction in size of the GOA circuit becomes important for those skilled in the art.

SUMMARY

In view of the above-described problems, the aim of the present disclosure is to provide a driving circuit of a display panel, a display device, and a method for driving the driving circuit of the display panel capable of simplifying design of the driving circuit of the display panel and improving stability of the driving circuit of the display panel.

The aim of the present disclosure is achieved by the following technical methods.

A driving circuit of a display panel comprises a switching unit, a clamping unit that prevents reverse current leakage, a reference signal line coupled to a low level signal, a pull-up unit, and a pull-up control unit that drives the pull-up unit. An input end of the pull-up unit receives a second clock signal, and an output end of the pull-up unit is coupled to a current scan line, where the current scan line is coupled to a pull-down maintain unit, and the pull-down maintain unit comprises a first switching unit and a second switching unit.

The first switching unit and the second switching unit are connected between the current scan line and the reference signal line in parallel, where a control end of the first switching unit and a control end of the second switching unit are coupled to an output end of the switching unit, a control end of the switching unit receives a first clock signal, and an input end of the switching unit receives the second clock signal through the clamping unit. A frequency of the second clock signal is greater than a frequency of the first clock signal.

Furthermore, a first controllable switch is connected in series between the control end of the first switching unit and the reference signal line, and a second controllable switch is connected in series between the control end of the second switching unit and the reference signal line, where a control end of the first controllable switch and a control end of the second controllable switch are coupled to the pull-up control unit.

When the current scan line is in a working time, the pull-up control unit drives the first controllable switch and the second controllable switch to turn on, and the first switching unit and the second switching unit are turned off; when the current scan line is in a non-working time, the pull-up control unit drives the first controllable switch and the second controllable switch to turn off, and the first switching unit and the second switching unit alternately turn on according to the first clock signal.

Furthermore, the first switching unit comprises a third controllable switch that is connected in series between the current scan line and the reference signal line, the switching unit comprises a fourth controllable switch that is connected in series between a control end of the third controllable switch and an output end of the clamping unit. A control end of the fourth controllable switch receives the first clock signal.

Furthermore, the second switching unit comprises a fifth controllable switch that is connected in series between the current scan line and the reference signal line. The switching unit comprises a sixth controllable switch that is connected in series between a control end of the fifth controllable switch and the output end of the clamping unit, a seventh controllable switch that is connected in series between a control end of sixth controllable switch and the reference signal line, and an eighth controllable switch that is connected in series between the control end of sixth controllable switch and an input end of the clamping unit. A control end of the eighth controllable switch receives the second clock signal.

Furthermore, the first switching unit comprises a third controllable switch that is connected in series between the current scan line and the reference signal line, and the second switching unit comprises a fifth controllable switch that is connected in series between the current scan line and the reference signal line. The switching unit comprises a fourth controllable switch that is connected in series between a control end of the third controllable switch and an output end of the clamping unit, and a sixth controllable switch that is connected in series between a control end of the fifth controllable switch and the output end of the clamping unit. A control end of the fourth controllable switch receives the first clock signal, and logical operation of the sixth controllable switch is opposite to logical operation of the fourth controllable switch.

Furthermore, an energy-storage capacitor and a twelfth controllable switch are connected in series between a control end of the pull-up unit and the current scan line, and a control end of the twelfth controllable switch receives the second clock signal.

Furthermore, the clamping unit comprises a ninth controllable switch, and a control end and an input end of the ninth controllable switch receive the second clock signal. The pull-up control unit comprises a tenth controllable switch, and a control end and an input end of the tenth controllable switch are coupled to a previous scan line that is driven prior to the current scan line. The pull-up unit comprises an eleventh controllable switch, and a control end of the eleventh controllable switch is coupled to an output end of the tenth controllable switch, and an input end of the eleventh controllable switch receives the second clock signal.

A thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

Furthermore, the clamping unit comprises a ninth controllable switch, and the pull-up control unit comprises a tenth controllable switch, and the pull-up unit comprises an eleventh controllable switch. A control end and an input end of the ninth controllable switch receive the second clock signal, a control end and an input end of the tenth controllable switch are coupled to a previous scan line that is driven prior to the current scan line, a control end of the eleventh controllable switch is coupled to an output end of the tenth controllable switch, and an input end of the eleventh controllable switch receives the second clock signal.

The first switching unit comprises a third controllable switch that is connected in series between the current scan line and the reference signal line. The switching unit comprises a fourth controllable switch that is connected in series between a control end of the third controllable switch and an output end of the ninth controllable switch, where a control end of the fourth controllable switch receives the first clock signal.

The second switching unit comprises a fifth controllable switch that is connected in series between the current scan line and the reference signal line. The switching unit comprises a sixth controllable switch that is connected in series between a control end of the fifth controllable switch and the output end of the ninth controllable switch, a seventh controllable switch that is connected in series between a control end of sixth controllable switch and the reference signal line, and an eighth controllable switch that is connected in series between the control end of sixth controllable switch and an input end of ninth controllable switch. A control end of the eighth controllable switch receives the second clock signal.

An energy-storage capacitor and a twelfth controllable switch are connected in series between a control end of the pull-up unit and the current scan line, and a control end of the twelfth controllable switch receives the second clock signal.

A thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

A display device comprises a driving circuit of a display panel of the present disclosure.

A method for driving a driving circuit of a display panel of the present disclosure comprises:

driving the pull-up unit to turn on by the pull-up control unit, and sending the second clock signal to the current scan line through the pull-up unit; and driving the pull-up unit to turn off by the pull-up control unit after a preset driving time, and controlling the switching unit to switch by the first clock signal; driving the first switching unit and the second switching unit to alternately turn on by the second clock signal through the clamping unit and the switching unit.

The present disclosure use one first clock signal to control two switching unit to alternately turn on, which avoids long-term effects of the voltage of the control end of a single switching unit affecting the single switching unit, and improves stability of the GOA circuit. In addition, the second clock signal is used to drive the switching unit, and the clamping unit is arranged on the GOA circuit, when the second clock signal is at the low level, the reverse current leakage is not generated for the switching unit corresponding the second clock signal, and the switching unit corresponding the second clock signal keeps on to ensure the current scan line Gn to be at the low level in non-working time. Therefore, one switching unit is chosen and the switching unit receives a voltage of a periodic high level (logic 1) of the second clock signal, which further improves stability of the GOA circuit. In the present disclosure, only one low level control signal is needed, which makes the current scan line be at the low level in the non-working time through matching of the second clock signal. Correspondingly, in the present disclosure, only one pull-down maintain unit is needed, which reduces number of the elements and reduces space of the GOA circuit.

DETAILED DESCRIPTION

The present disclosure provides a display device comprising a driving circuit (hereinafter referred as a gate driver on array (GOA) circuit) of the display panel.

Figure 1:
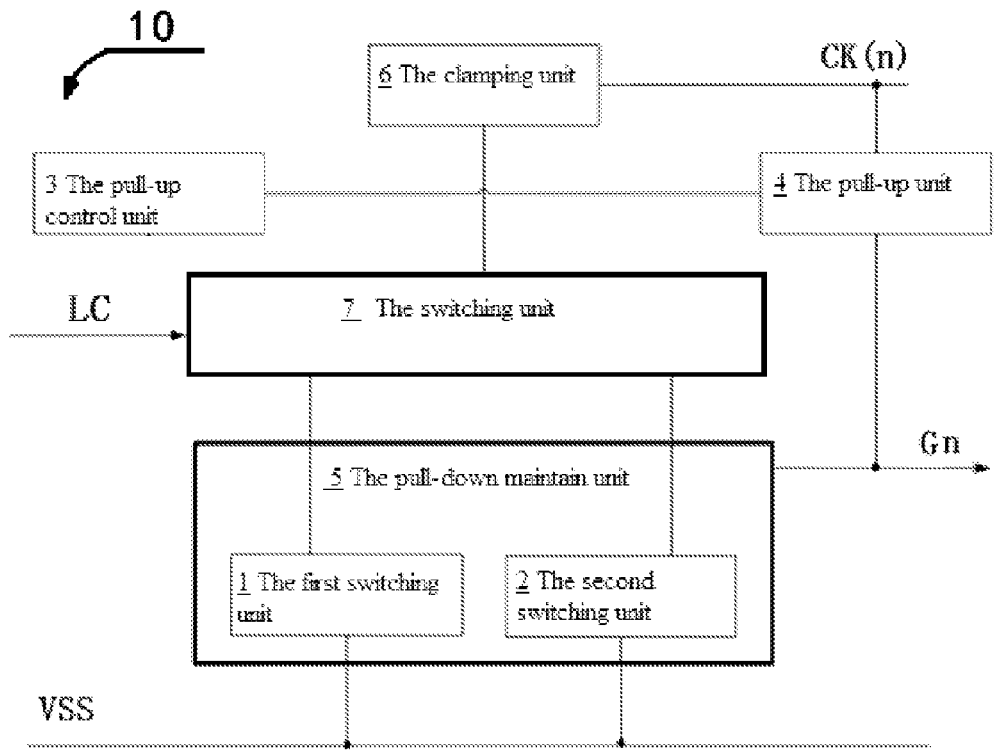
FIG. 1 is a schematic block diagram of a gate driver on array (GOA) circuit of the present disclosure.

As shown in FIG. 1, the GOA circuit 10 comprises a switching unit 7, a clamping unit 6 that prevents reverse current leakage, a reference signal line VSS coupled to a low level signal (logic 0), a pull-up unit 4, and a pull-up control unit 3 that drives the pull-up unit 4, where an input end of the pull-up unit 4 receives a second clock signal CK(n), and an output end of the pull-up unit 4 is coupled to a current scan line Gn. The current scan line Gn is coupled to a pull-down maintain unit 5, where the pull-down maintain unit 5 comprises a first switching unit 1 and a second switching unit 2. The first switching unit 1 and the second switching unit 2 are parallelly connected between the current scan line Gn and the reference signal line VSS.

A control end of the first switching unit 1 and a control end of the second switching unit 2 are coupled to an output end of the switching unit 7, a control end of the switching unit 7 receives a first clock signal LC, and an input end of the switching unit 7 receives the second clock signal CK(n) through the clamping unit 6, where frequency of the second clock signal CK(n) is greater than frequency of the first clock signal LC.

In the present disclosure, the first clock signal LC is used to control the first switching unit 1 and the second switching unit 2 to alternately turn on, which avoids long-term effects of the voltage of the control end of a single switching unit affecting the single switching unit, and improves stability of the GOA circuit. In addition, the second clock signal CK(n) is used to drive the switching unit, and the clamping unit is arranged on the GOA circuit, when the second clock signal is at the low level, the reverse current leakage is not generated for the switching unit corresponding the second clock signal, and the switching unit corresponding the second clock signal keeps on to ensure the current scan line Gn to be at the low level in non-working time. Therefore, one switching unit is chosen, and the switching unit receives a voltage of a periodic high level (logic 1) of the second clock signal CK(n), which further improves stability of the GOA circuit. In the present disclosure, only one low level control signal is needed, which makes the current scan line Gn be at the low level in the non-working time through matching of the second clock signal CK(n). Correspondingly, in the present disclosure, only one pull-down maintain unit 5 is needed, which reduces number of the elements and reduces space of the GOA circuit.

The present disclosure will further be described in detail in accordance with the figures and the exemplary examples.

Example 1

Figure 2:
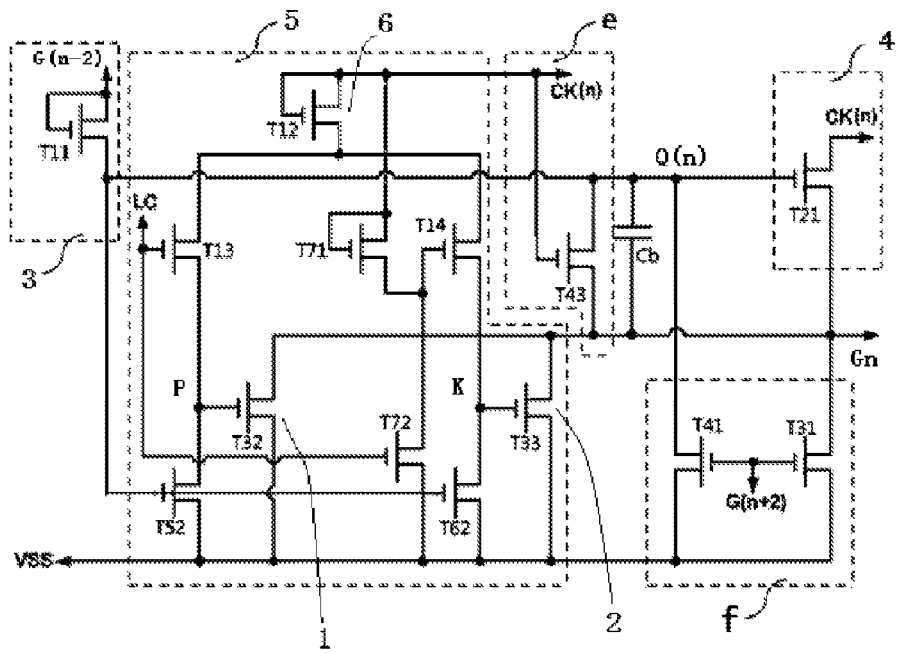
FIG. 2 is a schematic diagram of the GOA circuit of a first example of the present disclosure.

As shown in FIG. 2, a first example provides a single-stage GOA circuit, where the GOA circuit comprises the reference signal line VSS receiving the low level signal, the pull-up unit 4, and the pull-up control unit 3 that drives the pull-up unit 4. The input end of the pull-up unit 4 receives the second clock signal CK(n), and the output end of the pull-up unit 4 is coupled to the current scan line Gn. The current scan line Gn is coupled to the pull-down maintain unit 5, where the pull-down maintain unit 5 comprises the first switching unit 1 and the second switching unit 2. The first switching unit 1 and the second switching unit 2 are parallelly connected between the current scan line Gn and the reference signal line VSS.

The control end of the first switching unit 1 and the control end of the second switching unit 2 are coupled to the output end of the switching unit 7, and the input end of the switching unit 7 receives the second clock signal CK(n) through the clamping unit 6.

A first controllable switch T52 is connected in series between the control end of the first switching unit 1 and the reference signal line VSS, and a second controllable switch T62 is connected in series between the control end of the second switching unit 2 and the reference signal line VSS. A control end of the first controllable switch T52 and a control end of the second controllable switch T62 are coupled to the pull-up control unit 3.

When the current scan line Gn is in a working time, the pull-up control unit 3 drives the first controllable switch T52 and the second controllable switch T62 to turn on, and the first switching unit 1 and the second switching unit 2 turn off. When the current scan line Gn is in a non-working time, the pull-up control unit 3 drives the first controllable switch T52 and the second controllable switch T62 to turn off, and the first switching unit 1 and the second switching unit 2 alternately turn on according to the first clock signal LC.

The clamping unit 6 comprises a ninth controllable switch T12, the pull-up control unit 3 comprises a tenth controllable switch T11, and the pull-up unit 4 comprises an eleventh controllable switch T21. A control end and an input end of the ninth controllable switch T12 receive the second clock signal CK(n), a control end and an input end of the tenth controllable switch T11 are coupled to a previous scan line G(n−2) which is driven prior to the current scan line Gn. A control end of the eleventh controllable switch T21 is coupled to an output end of the tenth controllable switch T11, and an input end of the eleventh controllable switch T21 receives the second clock signal CK(n).

The first switching unit 1 comprises a third controllable switch T32 that is connected in series between the current scan line Gn and the reference signal line VSS. The switching unit 7 comprises a fourth controllable switch T13 that is connected in series between a control end of the third controllable switch T32 and an output end of the ninth controllable switch T12. A control end of the fourth controllable switch T13 receives the first clock signal LC.

The second switching unit 2 comprises a fifth controllable switch T33 that is connected in series between the current scan line Gn and the reference signal line VSS. The switching unit 7 further comprises a sixth controllable switch T14 that is connected in series between a control end of the fifth controllable switch T33 and the output end of the ninth controllable switch T12, a seventh controllable switch T72 that is connected in series between a control end of sixth controllable switch T14 and the reference signal line VSS, and an eighth controllable switch T71 that is connected in series between the control end of sixth controllable switch T14 and an input end of the ninth controllable switch T12. A control end of the eighth controllable switch T71 receives the second clock signal CK(n).

An energy-storage capacitor and a twelfth controllable switch T43 are connected in series between a control end of the pull-up unit 4 and the current scan line Gn, where a control end of the twelfth controllable switch T43 receives the second clock signal CK(n).

A thirteenth controllable switch T31 is connected in series between the current scan line Gn and the reference signal line VSS, and a fourteenth controllable switch T41 is connected in series between the control end of the pull-up unit 4 and the reference signal line VSS, where a control end of the thirteenth controllable switch T31 and a control end of the fourteenth controllable switch T41 are coupled to a next scan line G(n+2) that is driven after the current scan line. The thirteenth controllable switch T31 and the fourteenth controllable switch T41 form an area f as shown in FIG. 2. The thirteenth controllable switch T31 and the fourteenth controllable switch T41 discharge after the current scan line Gn is charged, where the thirteenth controllable switch T31 discharges to the current scan line Gn, and the fourteenth controllable switch T41 discharges to a control end Q(n) of the eleventh controllable switch T21.

Figure 3:
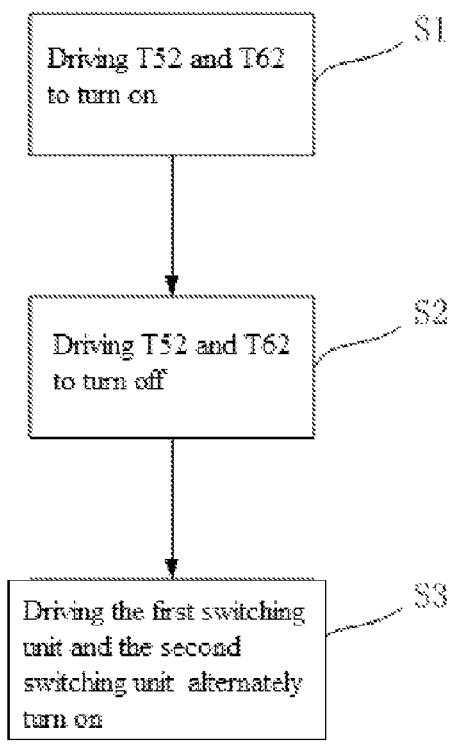
FIG. 3 is a flowchart of a method for driving the GOA circuit of the first example of the present disclosure.

As shown in FIG. 3, the example provides a method for driving the driving circuit of the display panel, the method comprises:

S1: driving the pull-up unit 4, the first controllable switch T52, and the second controllable switch T62 to turn on by the pull-up control unit 3, and sending the second clock signal CK(n) to the current scan line Gn through the pull-up unit 4;

S2: driving the pull-up unit 4, the first controllable switch T52, and the second controllable switch T62 to turn off by the pull-up control unit 3 after a preset driving time; and S3: controlling the switching unit 7 to switch by the first clock signal LC, and driving the first switching unit 1 and the second switching unit 2 to alternately turn on through the clamping unit 6 and the switching unit 7 by the second clock signal CK(n).

The present disclosure will take the controllable switch of a thin film transistor (TFT) as example to illustrate an operating principle of the present disclosure.

The TFT T11 controls a signal of a previous-stage GOA circuit to transmit a current-stage GOA circuit, which makes charging and discharging of each-stage the GOA circuit. The energy-storage capacitor is connected between the control end Q(n) of the TFT T21 and the current scan line Gn, where the energy-storage capacitor has a bootstrap function. When electric potential of the current scan line Gn increases, electric potential of the control end Q(n) of the TFT T21 correspondingly increases through coupling effects of the energy-storage capacitor, which makes the electric potential of the control end Q(n) of the TFT T21 increase and RC delay of the charging signal of the GOA circuit reduce. The TFTs of the pull-down maintain unit 5 may make the current scan line Gn keep at the low level in a non-charging stage.

In the non-charging stage of the pull-down maintain unit 5, when the control end Q(n) of the TFT T21 is at the low level, the TFT T52 and the TFT T62 turn off, and the first clock signal LC and the second clock signal CK(n) periodically control the TFT T13, the TFT T14, the TFT T71, and the TFT T72 to make the control end P of the TFT T32 and the control end K of the TFT T33 be alternately at a high level (logic 1) in the low frequency status, which is easy to alternately control the TFT T32 and the TFT T33 to turn on in the low frequency status to maintain the low level of the current scan line Gn, and avoids influence for the TFT T32 and the TFT T33 from long-time grid voltage stress.

To be specific, when the first clock signal LC is at the high level, the TFT T32 turns on. The control end P of the TFT T32 periodically receives the second clock signal CK(n), and is at the high level through the charging from the TFT T12 (connection method of the TFT T12 is a diode connection method, which avoids current leakage of the control end P of the TFT T32 through the TFT T12 when the second clock signal CK(n) is at low level), which makes the TFT T32 turn on to maintain the current scan line Gn at the low level. When the first clock signal LC is at the high level, the TFT T72 turns on, and electric potential of the grid electrode of the TFT T14 reduces to turn off the TFT T14. The TFT T62 is cyclic on, and the control end K of the TFT T33 is at the low level when the TFT T62 turns on, at this time, the TFT T33 turns off. When the first clock signal LC is at the low level, the TFT T72 and the TFT T13 turn off, and the control end P of the TFT T32 is at the low level, at this time, the TFT T32 turns off. When the first clock signal LC is at the low level, the grid electrode of the TFT T14 is charged by the second clock signal CK(n) to be at the high level, and the TFT T14 turns on to make the control end K of the TFT T33 be charged by the second clock signal CK(n) and be at the high level, which makes the TFT T33 turn on to maintain the current scan line Gn be at the low level. As the connection method of the TFT T12 is the diode connection method, when the first clock signal LC is at the high level, the TFT T13 turns on, and the second clock signal CK(n) is at the high level and the second clock signal CK(n) charges to the control end P of the TFT T32. When the second clock signal CK(n) is at the low level, the TFT T12 avoids the current leakage of the control end P of the TFT T32 through the TFT T12. Therefore, when the first clock signal LC is at the high level, the TFT T32 turns on to maintain the current scan line Gn at the low level.

In the charging stage, when the control end Q(n) of the TFT T21 is at the high level, the TFT T52 and the TFT T62 can turn on, and electric potentials of the control end P of the TFT T32 and the control end K of the TFT T33 are reduced to make the TFT T32 and the TFT T33 turn off. In the non-charging stage, because the TFT T32 and the TFT T33 alternately turn on in the low frequency status, when a time of switching the TFT T32 and the TFT T33 is corresponding to a time of switching display frames, the low level of the current scan line Gn is not affected, and the TFT T32 and the TFT T33, which have small size, can maintain the current scan line at the low level in non-charging stage. As shown in region e of FIG. 2, only the TFT T43 is driven by the second clock signal CK(n) having the high frequency to effectively control the electric potential of the control end Q(n) of the TFT T21 in the non-charging stage, and make the electric potential of the control end Q(n) of the TFT T21 not affect the electric potential of the current scan line Gn. Because the second clock signal CK(n) connected with a source electrode of the TFT T21 is at the low level, change of the electric potential of the control end Q(n) of the TFT T21 does not affect the current scan line Gn. Thus, when the second clock signal CK(n) is at the low level, the control end Q(n) of the TFT T21 maintains the low level without connecting the TFT. When the second clock signal CK(n) is at the high level, the TFT T43 turns on to maintain the control end Q(n) of the TFT T21 at low level in the non-charging stage.

In view of the above, the GOA circuit of the present disclosure drives a pull-down circuit through the first clock signal LC and the second clock signal CK(n) to reduce the spaces of the pull-down maintain unit 5 and size of the TFT of e area of the GOA circuit, thus, the GOA circuit is suitable for a flat display product having a narrow frame.

Figure 4:
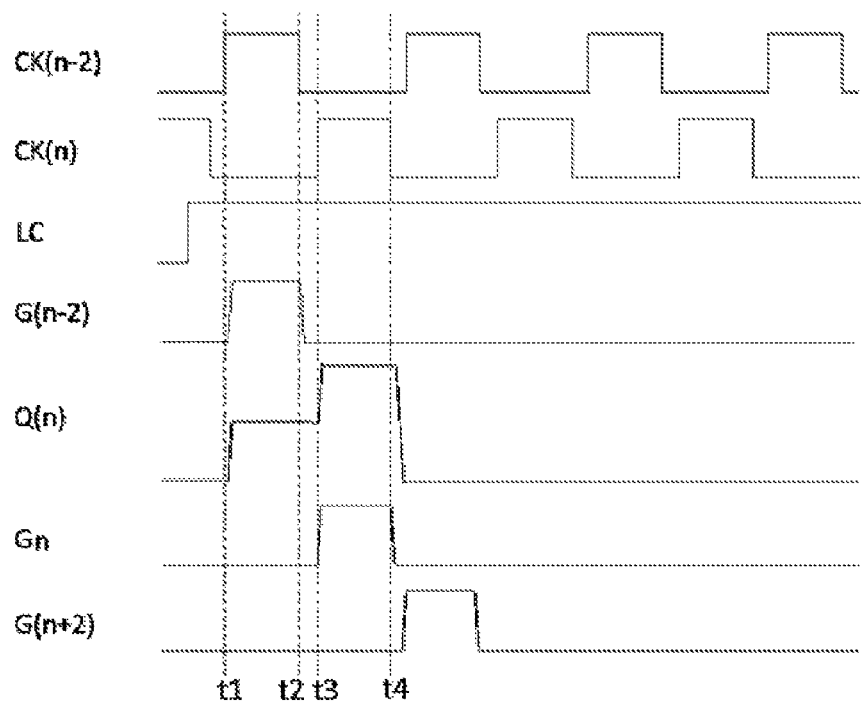
FIG. 4 is a schematic diagram of a driving waveform of the GOA circuit of the first example of the present disclosure.

FIG. 4 is a schematic diagram of a driving waveform of the GOA circuit of the present disclosure at room temperature (A duty ratio of the second clock signal CK(n) of the GOA circuit of the present disclosure is 40%, and a period of the first clock signal LC is more than a period of the second clock signal CK(n)). t1-t3 are regarded as readiness times of the current scan line Gn before the current scan line Gn is charged, t3-t4 are regarded as charging times of the current scan line Gn, and the current scan line Gn is discharged after t4. At the time of t1, electric potential of a previous second clock signal CK(n−2) increases, and electric potential of the previous scan line G(n−2) correspondingly increases, thus, the TFT T11 turns on and the control end Q(n) of the TFT T21 is charged. When the electric potential of the control end Q(n) of the TFT T21 increases, the TFT T52 and the TFT T56 turn on to reduce the electric potential of the control end P of the TFT T32 and electric potential of the control end K of the TFT T33, and the TFT T32 and the TFT T33 turn off, thus, the charging of the current scan line Gn is not affected by the TFT T32 and the TFT T33. At the time of t2, the electric potential of the previous second clock signal CK(n−2) reduces, the connection method of the TFT T11 is the diode connection method, which avoids current leakage of the control end Q(n) of the TFT T21 through the TFT T11, thus, the electric potential of the control end Q(n) of the TFT T21 is constant. At the time of t3, the electric potential of the second clock signal CK(n)

increases, the electric potential of the control end Q(n) of the TFT T21 bootstrap increases to control the TFT T21 to charge the current scan line.

To be special, an expectant output voltage of the current scan line Gn can be obtained through setting channel widths of the TFT T21 and the TFT T43. For example, when ratio of the channel width of the TFT T21 to the channel width of the TFT T43 is about 30 to 1, the electric potential of the current scan line Gn can be charged to an expectant electric potential within the time of 2 µs, and the current leakage of the TFT T43 is limited in the time of 2 µs. The above-mentioned design is simulated through an Eldo SPICE software, when the channel width of the TFT T21 is far greater than the channel width of the TFT T43, the current leakage of the TFT T43 is limited.

At the time of t4, electric potential of the second clock signal CK(n) reduces, and the electric potential of the control end Q(n) of the TFT T21 does not immediately reduce, the TFT T21 keeps on in a short time after the time of t4 to reduce the electric potential of the current scan line Gn. After that, the electric potential of the next scan line G(n+2) increases, and the TFT T31 and the TFT T41 turn on, which makes the current scan line Gn and the control end Q(n) of the TFT T21 reduce to be at the low level. The TFT T52 and the TFT T62 turn off when the control end Q(n) of the TFT T21 is at the low level, and the TFT T32 and the TFT T33 alternately turn on to maintain the current scan line Gn being at the low level in the non-charging stage.

Figure 5:
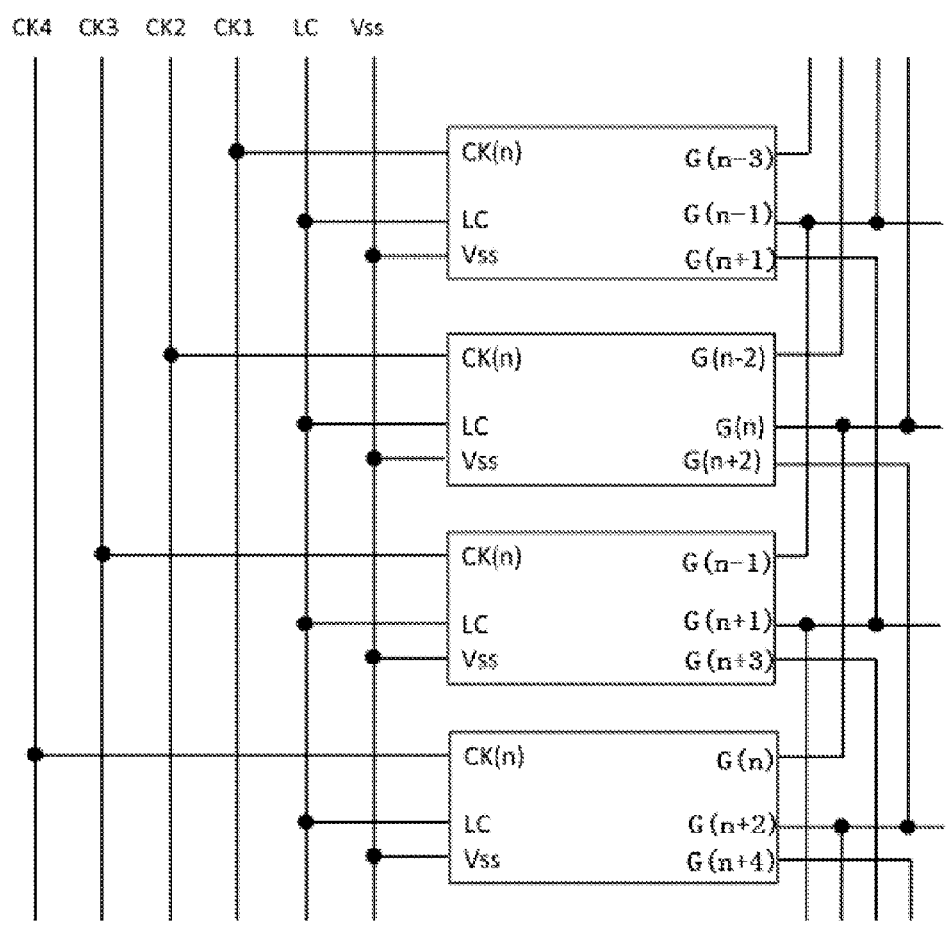
FIG. 5 is a schematic diagram of connection framework of the multi-stage GOA circuit of the first example of the present disclosure.

As shown in FIG. 5, the present disclosure provides the GOA circuit having a multi-stage structure, where one first clock signal LC, one direct current (DC) low level signal VSS, and four second clock signals CK1-CK4 are arranged at an outside of the each-stage GOA circuit (connection method of the single-stage is shown in FIG. 2). An n-th stage GOA circuit is connected with the previous scan line G(n−2) and the next scan line G(n+2), and the first clock signal LC, the DC low level signal VSS, and one second clock signal CK(n) are sent to the n-th stage GOA circuit to generate a signal to drive the current scan line Gn. As shown in FIG. 5, a connection method of the each-stage GOA circuit ensures the signal of the GOA circuit to be transmitted stage by stage, and makes the each-stage horizontal scan line be charged and discharged of stage by stage.

Figure 6:
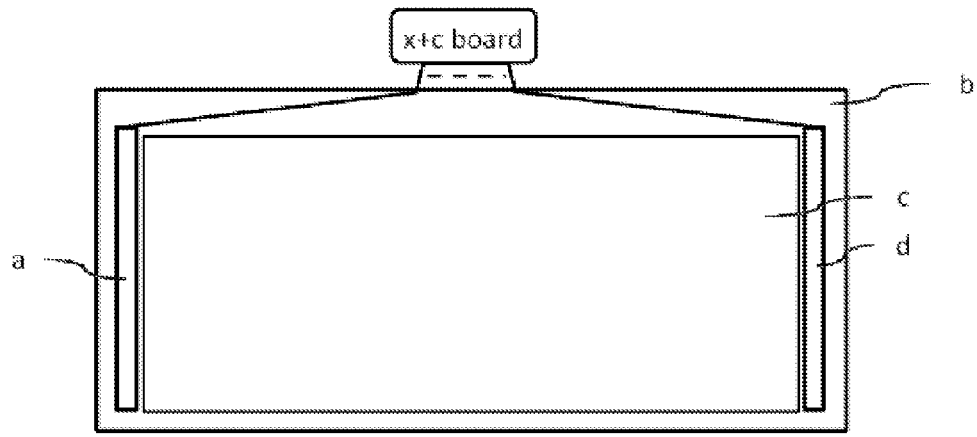
FIG. 6 is a schematic diagram of a display device using the GOA circuit of the present disclosure.

As shown in FIG. 6, the present disclosure provides a flat display device using the GOA circuit of the present disclosure, where b is a display substrate of the flat display device using the GOA circuit of the present disclosure. An x+c board arranged on the display substrate outputs a driving control signal to the display substrate, where the GOA circuit of the present disclosure is arranged on a left area a and a right area d of the display substrate, and the GOA circuit drives the horizontal scan lines arranged on a display area c from directions of the left and right areas. The GOA circuit receives the signal from the x+c board and generates the control signal of the horizontal scan line at each-stage GOA circuit to control pixels of the display area c to turn on line by line.

Example 2

The first switching unit 1 and the second switching unit 2 of the pull-down maintain unit of the present disclosure also have other design (other elements of the GOA circuit refer to the first example).

Figure 7:
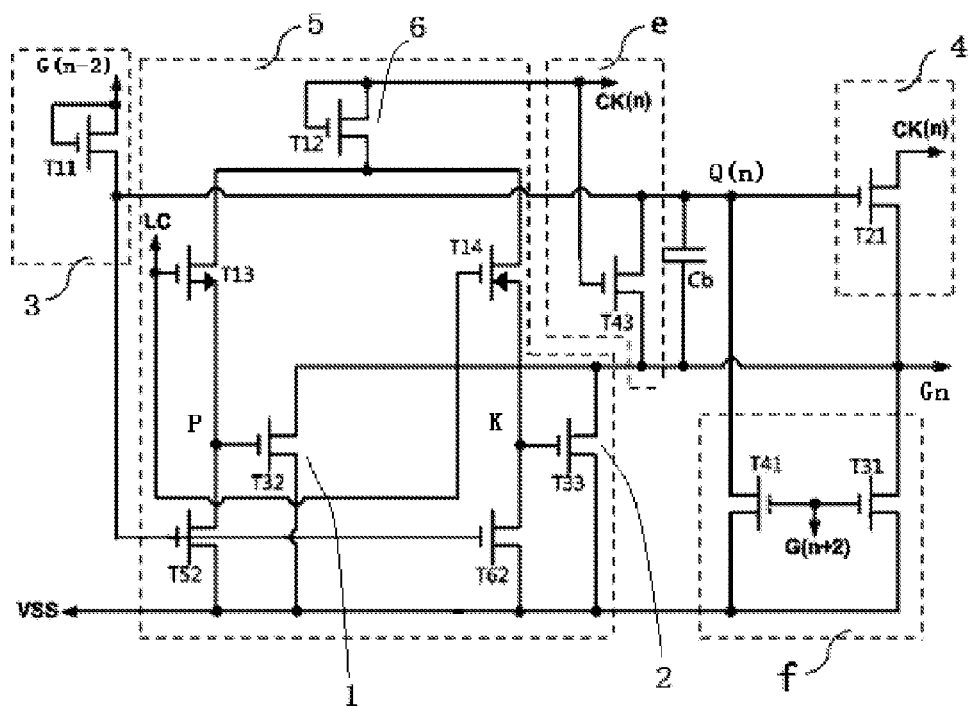
FIG. 7 is a schematic diagram of the GOA circuit of a second example of the present disclosure.

As shown in FIG. 7, the first switching unit 1 comprises the third controllable switch T32 and the fourth controllable switch T13, where the third controllable switch T32 are connected in series between the current scan line and the reference signal line, and the fourth controllable switch T13 is connected in series between the control end of the third controllable switch T32 and the output end of the clamping unit. The control end of the fourth controllable switch T13 receives the first clock signal LC.

The second switching unit 2 comprises the fifth controllable switch T33 and the sixth controllable switch T14, where the fifth controllable switch T33 are connected in series between the current scan line and the reference signal line, and the sixth controllable switch T14 is connected in series between the control end of the fifth controllable switch T33 and the output end of the clamping unit. The control end of the sixth controllable switch T14 receives the first clock signal LC, and logical operation of the sixth controllable switch T14 is opposite to logical operation of the fourth controllable switch T13. The present disclosure uses the controllable switch having opposite logical operation to allow the switching unit to alternate turn on, which further simplifies the control circuit and reduces space of the GOA circuit.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

I claim:
1. A driving circuit of a display panel, comprising
a switching unit;
a clamping unit that prevents reverse current leakage;
a reference signal line coupled to a low level signal;
a pull-up unit; and
a pull-up control unit that drives the pull-up unit;
wherein an input end of the pull-up unit receives a second clock signal, and an output end of the pull-up unit is coupled to a current scan line; the current scan line is coupled to a pull-down maintain unit, and the pull-down maintain unit comprises a first switching unit and a second switching unit; the first switching unit and the second switching unit are connected between the current scan line and the reference signal line in parallel;
wherein a control end of the first switching unit and a control end of the second switching unit are coupled to an output end of the switching unit, a control end of the switching unit receives a first clock signal, and an input end of the switching unit receives the second clock signal through the clamping unit; a frequency of the second clock signal is greater than a frequency of the first clock signal;
wherein a first controllable switch is connected in series between the control end of the first switching unit and the reference signal line, and a second controllable switch is connected in series between the control end of the second switching unit and the reference signal line; a control end of the first controllable switch and a control end of the second controllable switch are coupled to the pull-up control unit;
when the current scan line is active, the pull-up control unit drives the first controllable switch and the second controllable switch to turn on, and the first switching unit and the second switching unit are turned off; when the current scan line is in a state during a low-level period, the pull-up control unit drives the first control- lable switch and the second controllable switch to turn off, and the first switching unit and the second switching unit alternately turn on according to the first clock signal.

2. The driving circuit of the display panel of claim 1, wherein the first switching unit comprises a third controllable switch that is connected in series between the current scan line and the reference signal line; the switching unit comprises a fourth controllable switch that is connected in series between a control end of the third controllable switch and an output end of the clamping unit; a control end of the fourth controllable switch receives the first clock signal.

3. The driving circuit of the display panel of claim 1, wherein the second switching unit comprises a fifth controllable switch that is connected in series between the current scan line and the reference signal line; and the switching unit comprises a sixth controllable switch that is connected in series between a control end of the fifth controllable switch and the output end of the clamping unit, a seventh controllable switch that is connected in series between a control end of sixth controllable switch and the reference signal line, and an eighth controllable switch that is connected in series between the control end of sixth controllable switch and an input end of the clamping unit; Wherein a control end of the eighth controllable switch receives the second clock signal.

4. The driving circuit of the display panel of claim 1, wherein the first switching unit comprises a third controllable switch that is connected in series between the current scan line and the reference signal line, and the second switching unit comprises a fifth controllable switch that is connected in series between the current scan line and the reference signal line; the switching unit comprises a fourth controllable switch that is connected in series between a control end of the third controllable switch and an output end of the clamping unit, and a sixth controllable switch that is connected in series between a control end of the fifth controllable switch and the output end of the clamping unit; a control end of the fourth controllable switch receives the first clock signal, and logical operation of the sixth controllable switch is opposite to logical operation of the fourth controllable switch.

5. The driving circuit of the display panel of claim 1, wherein an energy-storage capacitor and a twelfth controllable switch each is connected in series between a control end of the pull-up unit and the current scan line, the energy-storage capacitor and the twelfth controllable switch are parallel with each other, and a control end of the twelfth controllable switch receives the second clock signal.

6. The driving circuit of the display panel of claim 2, wherein an energy-storage capacitor and a twelfth controllable switch each is connected in series between a control end of the pull-up unit and the current scan line, the energy-storage capacitor and the twelfth controllable switch are parallel with each other, and a control end of the twelfth controllable switch receives the second clock signal.

7. The driving circuit of the display panel of claim 3, wherein an energy-storage capacitor and a twelfth controllable switch each is connected in series between a control end of the pull-up unit and the current scan line, the energy-storage capacitor and the twelfth controllable switch are parallel with each other, and a control end of the twelfth controllable switch receives the second clock signal.

8. The driving circuit of the display panel of claim 4, wherein an energy-storage capacitor and a twelfth controllable switch each is connected in series between a control end of the pull-up unit and the current scan line, the energy-storage capacitor and the twelfth controllable switch are parallel with each other, and a control end of the twelfth controllable switch receives the second clock signal.

9. The driving circuit of the display panel of claim 1, wherein the clamping unit comprises a ninth controllable switch, and a control end and an input end of the ninth controllable switch receives the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

10. The driving circuit of the display panel of claim 1, wherein the clamping unit comprises a ninth controllable switch, and a control end and an input end of the ninth controllable switch receive the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

11. The driving circuit of the display panel of claim 2, wherein the clamping unit comprises a ninth controllable switch, and a control end and an input end of the ninth controllable switch receive the second clock signal; the control unit comprises a tenth controllable switch, and a control end and an input end of the tenth controllable switch are coupled to a previous scan line that is drives prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

12. The driving circuit of the display panel of claim 3, wherein the clamping unit comprises a ninth controllable switch, and a control end and an input end of the ninth controllable switch receives the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

13. The driving circuit of the display panel of claim 4, wherein clamping unit comprises a ninth controllable switch, and a control end and an input end of the ninth controllable switch receives the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

14. The driving circuit of the display panel of claim 1, wherein the clamping unit comprises a ninth controllable switch, and a control end and an input end of the ninth controllable switch receives the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, and a control end of the eleventh controllable switch is coupled to an output end of the tenth controllable switch, and an input end of the eleventh controllable switch receives the second clock signal;

wherein the first switching unit comprises a third controllable switch that is connected in series between the current scan line and the reference signal line; and the switching unit comprises a fourth controllable switch that is connected in series between a control end of the third controllable switch and an output end of the ninth controllable switch; a control end of the fourth controllable switch receives the first clock signal;

wherein the second switching unit comprises a fifth controllable switch that is connected in series between the current scan line and the reference signal line; and the switching unit comprises a sixth controllable switch that is connected in series between a control end of the fifth controllable switch and the output end of the ninth controllable switch, a seventh controllable switch that is connected in series between a control end of sixth controllable switch and the reference signal line, and an eighth controllable switch that is connected in series between the control end of sixth controllable switch and an input end of ninth controllable switch; wherein a control end of the eighth controllable switch receives the second clock signal;

wherein an energy-storage capacitor and a twelfth controllable switch are connected in series between a control end of the pull-up unit and the current scan line, and a control end of the twelfth controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch and a control end of the fourteenth controllable switch are coupled to a next scan line that is driven after the current scan line.

15. A display device comprising:
a driving circuit of a display panel comprising a switching unit, a clamping unit that prevents reverse current leakage, a reference signal line coupled to a low level signal, a pull-up unit, and a pull-up control unit that drives the pull-up unit;

wherein an input end of the pull-up unit receives a second clock signal, and an output end of the pull-up unit is coupled to a current scan line; the current scan line is coupled to a pull-down maintain unit, and the pull-down maintain unit comprises a first switching unit and a second switching unit; the first switching unit and the second switching unit are connected between the current scan line and the reference signal line in parallel;

wherein a control end of the first switching unit and a control end of the second switching unit are coupled to an output end of the switching unit, and a control end of the switching unit receives a first clock signal and an input end of the switching unit receives the second clock signal through the clamping unit;

wherein a first controllable switch is connected in series between the control end of the first switching unit hind the reference signal line, and a second controllable switch is connected in series between the control end of the second switching unit and the reference signal line; a control end of the first controllable switch and a control end of the second controllable switch are coupled to the pull-up control unit;

when the current scan line is in a state during a high-level period, the pull-up control unit drives the first controllable switch and the second controllable switch to turn on, and the first switching unit and the second switching unit turn off;

when the current scan line is in a state dining a low-level period, the pull-up control unit drives the first controllable switch and the second controllable switch to turn off, and the first switching and the second switching unit alternately turn on according to the first clock signal;

wherein the first switching unit comprises a third controllable switch that is connected in series between the current scan line and the reference signal line; and the switching unit comprises a fourth controllable switch that is connected in series between a control end of the third controllable switch and an output end of the clamping unit; a control end of the fourth controllable switch receives the first clock signal;

wherein the second switching unit comprises a fifth controllable switch that is connected in series between the current scan line and the reference signal line; and the switching unit comprises a sixth controllable switch that is connected in series between a control end of the fifth controllable switch and the output end of the clamping unit, a seventh controllable switch that is connected in series between a control end of sixth controllable switch and the reference signal line, and an eighth controllable switch that is connected in series between the control end of sixth controllable switch and an input end of the clamping unit; wherein a control end of the eighth controllable switch receives the second clock signal;

wherein the first switching unit comprises the third controllable switch that is connected in series between the current scan line and the reference signal line, and the second switching unit comprises the fifth controllable switch that is connected in series between the current scan line and the reference signal line; the switching unit comprises the fourth controllable switch that is connected in series between the control end of the third controllable switch and the output end of the clamping unit, and the sixth controllable switch that is connected in series between the control end of the fifth controllable switch and the output end of the clamping unit; the control end of the fourth controllable switch receives the first clock signal, and logical operation of the sixth controllable switch is opposite to logical operation of the fourth controllable switch;

the claming unit comprise a ninth controllable switch, and a control end and an input end of the ninth controllable switch receives the second clock signal; the pull-up control unit comprises a tenth controllable switch, and a control end and an input end of the tenth controllable switch are coupled to a previous scan line that is driven prior to the current scan line; the pull-up unit comprises an eleventh controllable switch, a control end of the eleventh controllable switch is coupled to an output end of the tenth controllable switch, and an input end of the eleventh controllable switch receives the second clock signal;

wherein the first switching unit comprises the third controllable switch that is connected in series between the current scan line and the reference signal line, and the switching unit comprises the fourth controllable switch that is connected in series between the control end of the third controllable switch and the output end of the ninth controllable switch; the control end of the fourth controllable switch receives the first clock signal;

wherein the second switching unit comprises the fifth controllable switch that is connected in series between the current scan line and the reference signal line; and the switching unit comprises the sixth controllable switch that is connected in series between the control end of the fifth controllable switch and the output end of the ninth controllable switch, the seventh controllable switch that is connected in series between the control end of sixth controllable switch and the reference signal line, and the eighth controllable switch that is connected in series between the control end of sixth controllable switch and an input end of ninth controllable switch; wherein the control end of the eighth controllable switch receives the second clock signal;

wherein an energy-storage capacitor and a twelfth controllable switch are connected in series between a control end of the pull-up unit and the current scan line, and a control end of the twelfth controllable switch receives the second clock signal;

wherein a thirteenth controllable switch is connected in series between the current scan line and the reference signal line, and a fourteenth controllable switch is connected in series between the control end of the pull-up unit and the reference signal line, and a control end of the thirteenth controllable switch id a control end of the fourteenth controllable switch are coupled to a next scan line that is driven after the current scan line.

\* \* \* \* \*